United States Patent
Law et al.

(10) Patent No.: US 8,120,086 B2
(45) Date of Patent: Feb. 21, 2012

(54) LOW LEAKAGE CAPACITORS INCLUDING PORTIONS IN INTER-LAYER DIELECTRICS

(75) Inventors: Oscar M. K. Law, Hsin-Chu (TW); Kong-Beng Thei, Hsin-Chu (TW); Harry Chuang, Hsin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 64 days.

(21) Appl. No.: 12/331,109

(22) Filed: Dec. 9, 2008

(65) Prior Publication Data

US 2010/0078695 A1 Apr. 1, 2010

Related U.S. Application Data

(60) Provisional application No. 61/101,427, filed on Sep. 30, 2008.

(51) Int. Cl.
*H01L 27/108* (2006.01)
*H01L 29/94* (2006.01)

(52) U.S. Cl. ........... 257/307; 257/296; 257/E21.016; 257/E27.071; 438/239; 438/396

(58) Field of Classification Search ........... 257/E27.071, 257/E27.07, E21.016, 307; 361/306.3
See application file for complete search history.

(56) References Cited

U.S. PATENT DOCUMENTS

| | | | |
|---|---|---|---|
| 4,954,927 A | 9/1990 | Park | |
| 5,304,506 A | 4/1994 | Porter et al. | |
| 5,583,359 A * | 12/1996 | Ng et al. | 257/306 |
| 5,939,766 A * | 8/1999 | Stolmeijer et al. | 257/534 |
| 6,103,621 A | 8/2000 | Huang | |
| 6,104,053 A | 8/2000 | Nagai | |
| 6,306,721 B1 | 10/2001 | Teo et al. | |
| 6,383,858 B1 * | 5/2002 | Gupta et al. | 438/238 |
| 6,653,681 B2 * | 11/2003 | Appel | 257/307 |
| 6,730,581 B2 * | 5/2004 | Suguro | 438/486 |
| 6,743,671 B2 | 6/2004 | Hu et al. | |
| 6,819,542 B2 * | 11/2004 | Tsai et al. | 361/304 |
| 7,126,809 B2 | 10/2006 | Iioka et al. | |
| 7,209,340 B2 | 4/2007 | Iioka et al. | |
| 7,485,914 B2 | 2/2009 | Huang et al. | |
| 7,554,117 B2 | 6/2009 | Nakamura | |

(Continued)

FOREIGN PATENT DOCUMENTS

CN 1765009 A 4/2006

(Continued)

*Primary Examiner* — Ha Tran T Nguyen
*Assistant Examiner* — Shaka Scarlett
(74) *Attorney, Agent, or Firm* — Slater & Matsil, L.L.P.

(57) ABSTRACT

An integrated circuit structure includes a semiconductor substrate including a first region and a second region; an insulation region in the second region of the semiconductor substrate; and an inter-layer dielectric (ILD) over the insulation region. A transistor is in the first region. The transistor includes a gate dielectric and a gate electrode over the gate dielectric. A first conductive line and a second conductive line are over the insulation region. The first conductive line and the second conductive line are substantially parallel to each other and extending in a first direction. A first metal line and a second metal line are in a bottom metal layer (M1) and extending in the first direction. The first metal line and the second metal line substantially vertically overlap the first conductive line and the second conductive line, respectively. The first metal line and the second metal line form two capacitor electrodes of a capacitor.

17 Claims, 7 Drawing Sheets

U.S. PATENT DOCUMENTS

| | | |
|---|---|---|
| 2002/0094643 A1* | 7/2002 | Solomon et al. ............... 438/279 |
| 2002/0195669 A1 | 12/2002 | Morihara et al. |
| 2003/0036244 A1 | 2/2003 | Jones et al. |
| 2003/0183864 A1 | 10/2003 | Miyazawa |
| 2004/0140487 A1* | 7/2004 | Furumiya et al. ............. 257/211 |
| 2005/0145987 A1* | 7/2005 | Okuda et al. .................. 257/532 |
| 2006/0006496 A1 | 1/2006 | Harris et al. |
| 2007/0296013 A1 | 12/2007 | Chang et al. |
| 2009/0090951 A1* | 4/2009 | Chang et al. .................. 257/306 |
| 2009/0325376 A1 | 12/2009 | Nakamura |

FOREIGN PATENT DOCUMENTS

| | | |
|---|---|---|
| CN | 1835235 A | 9/2006 |

* cited by examiner

LOW LEAKAGE CAPACITORS INCLUDING PORTIONS IN INTER-LAYER DIELECTRICS

This application claims the benefit of U.S. Provisional Application Ser. No. 61/101,427, filed Sep. 30, 2008, and entitled, "Low Leakage Capacitors Including Portions in Inter-Layer Dielectrics," which application is hereby incorporated herein by reference.

CROSS-REFERENCE TO RELATED APPLICATION

This application relates to commonly-assigned U.S. patent application Ser. No. 11/868,856, filed Oct. 8, 2007, and entitled "Capacitor Integrated with Metal Gate Formation," which application is hereby incorporated herein by reference.

TECHNICAL FIELD

This invention relates generally to semiconductor devices, and more particularly to capacitors and methods of forming the same.

BACKGROUND

Digital applications often require decoupling capacitor(s) for the purpose of reducing power noise. The decoupling capacitors may be connected between VDD power rails and VSS power rails, so that high-frequency inductance noise will be eliminated due to the shorting effect of the decoupling capacitors for high-frequency signals.

Currently, there are various types of decoupling capacitors. For example, the decoupling capacitors may be made of transistors. FIG. 1 illustrates conventional decoupling capacitors formed by shorting the source and drain regions of transistors. The gates of the transistors are coupled to VDD or VSS power rails. Accordingly, if a power surge, for example, an electrostatic discharge (ESD), occurs to one of the VDD or VSS power rails, the transistors may be damaged.

FIG. 2 illustrates another type of decoupling capacitor made of transistors, which, instead of having their gates connected to VDD and VSS power rails, have their sources/drains connected to the VDD and VSS power rails. Accordingly, the decoupling capacitor suffers less from the power surges. However, the transistors as shown in FIG. 2 were typically implemented using thick gate oxide with long device channels. When they are formed in core device regions, both the oxide thickness uniformity and critical dimension uniformity (which affects the gate width) are adversely affected. The situation is further worsened when the technology for forming the integrated circuit is down-scaled to 32 nm, which requires a very restricted rule as to the layouts of the integrated circuits. In addition, the decoupling capacitor as shown in FIG. 2 suffers from sub-threshold leakage.

The decoupling capacitors may also be formed of two conductive electrodes, as shown in FIGS. 3 through 6, which may be divided into poly-diffusion capacitors, poly-poly capacitors, metal-poly capacitors, and metal-metal capacitors. FIG. 3 illustrates a poly-diffusion capacitor, with a polysilicon (poly) plate and a diffusion region acting as the plates of the respective capacitor. This type of capacitor suffers from non-linearity caused by the change in the size of the depletion region in the diffusion region, which size changes with the applied voltage. FIGS. 4 and 5 illustrate a poly-poly capacitor and a metal-poly capacitor, respectively. These types of capacitors typically require extra process steps, and thus are more costly than other types of capacitors. FIG. 6 illustrates a metal-oxide-metal (MOM) capacitor, which may be formed in more than one metal layer. In each of the metal layers, metal fingers are placed in an alternating pattern to form a capacitor. The fingers in neighboring metal layers are arranged perpendicular to each other. The capacitance of such type of capacitor highly depends on the coupling capacitance between metal layers. Apparently, the MOM capacitor requires large chip area in a plurality of metal layers.

Accordingly, what are needed in the art are capacitors suffering less from leakage currents and occupying less chip area. The capacitance per unit area also needs to be high so that the capacitors can be formed in advanced technologies, such as 32 nm technology and below.

SUMMARY OF THE INVENTION

In accordance with one aspect of the present invention, an integrated circuit structure includes a semiconductor substrate including a first region and a second region; an insulation region in the second region of the semiconductor substrate; and an inter-layer dielectric (ILD) over the insulation region. A transistor is in the first region. The transistor includes a gate dielectric, and a gate electrode over the gate dielectric. A first conductive line and a second conductive line are over the insulation region. The first conductive line and the second conductive line are substantially parallel to each other and extend in a first direction. A first metal line and a second metal line are in a metal layer over the ILD and extend in the first direction. The first metal line and the second metal line substantially vertically overlap the first conductive line and the second conductive line, respectively. The first metal line and the second metal line form two capacitor electrodes of a capacitor.

In accordance with another aspect of the present invention, an integrated circuit structure includes a semiconductor substrate; an ILD over the semiconductor substrate; a metal layer over the ILD; and a capacitor over the semiconductor substrate. The capacitor includes a first layer in the ILD and includes a first capacitor electrode and a second capacitor electrode, each including a bus and fingers connected to the bus. The fingers of the first capacitor electrode and the second capacitor electrode are parallel to each other and are placed in an alternating pattern. The capacitor further includes a second layer in the metal layer and includes a third capacitor electrode and a fourth capacitor electrode insulated from each other. Each of the third capacitor electrode and the fourth capacitor electrode includes a bus and fingers connected to the bus. The fingers of the third capacitor electrode and the fourth capacitor electrode are parallel to the fingers of the first capacitor electrode and the second capacitor electrode, and are placed in an alternating pattern. Each of the fingers of the first capacitor electrode vertically overlaps one of the fingers of the fourth capacitor electrode, and each of the fingers of the second capacitor electrode vertically overlaps one of the fingers of the third capacitor electrode.

In accordance with yet another aspect of the present invention, an integrated circuit structure includes a semiconductor substrate including a first region and a second region; an insulation region in the second region of the semiconductor substrate; and an ILD over the insulation region. A transistor is in the first region. The transistor includes a gate dielectric; and a gate electrode in the ILD and over the gate dielectric, wherein the gate dielectric includes portions extending on opposite sidewalls of the gate electrode. The integrated circuit structure further includes a capacitor, which includes first conductive lines directly over the insulation region and in the ILD, with the first conductive lines being interconnected; and second conductive lines directly over the insulation region and in the ILD. The first conductive lines and the second conductive lines are substantially evenly spaced from each other with a first pitch. The first conductive lines and the second conductive lines are also substantially parallel and arranged in an alternating pattern. The capacitor further includes first metal lines and second metal lines in a bottom metal layer and parallel to the first conductive lines. The first metal lines are interconnected, with each of the first metal lines vertically overlapping one of the first conductive lines. The second metal lines are interconnected, wherein each of the second metal lines vertically overlaps one of the second conductive lines. The first metal lines are connected to the second conductive lines, and the second metal lines are connected to the first conductive lines.

The advantageous features of the present invention include improved capacitance per unit chip area, and compatibility with the down-scaling of integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel capacitor structure and the methods of forming the same are provided. The variations of the preferred embodiments are then discussed. Throughout the various views and illustrative embodiments of the present invention, like reference numbers are used to designate like elements.

Figure 1:
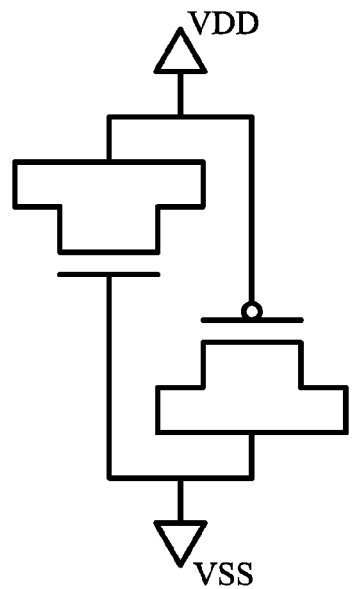
FIGS. 1 through 6 are conventional decoupling capacitors having different structures.
Figure 2:
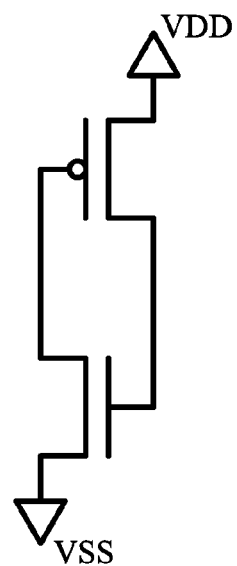
Figure 3:
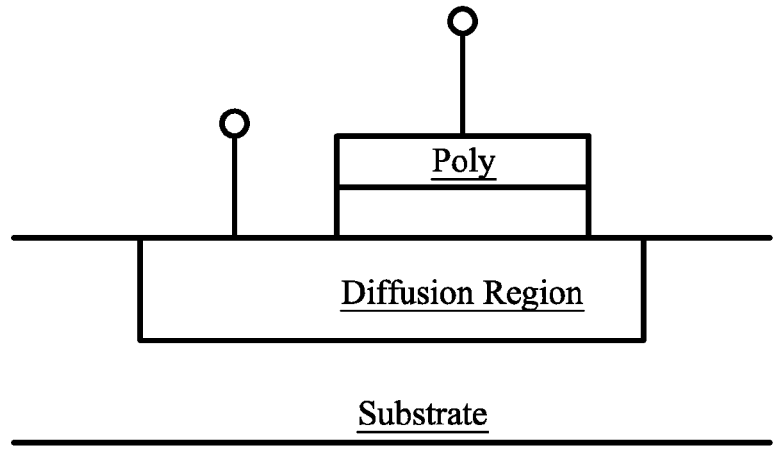
Figure 4:
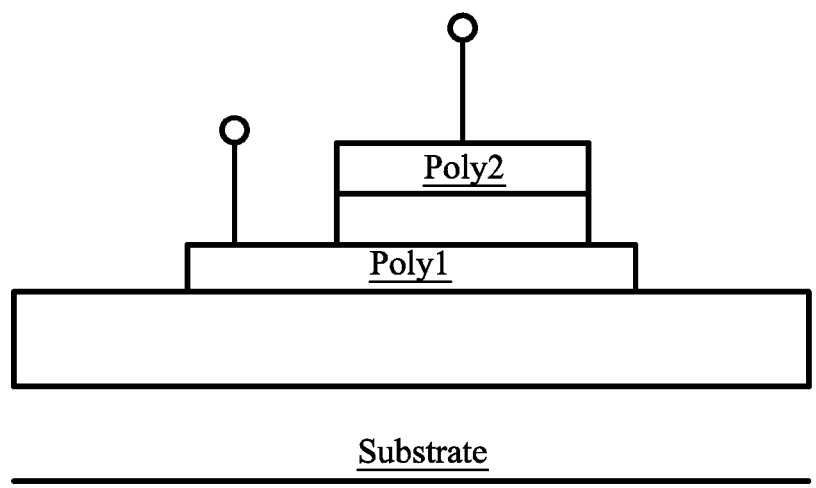
Figure 5:
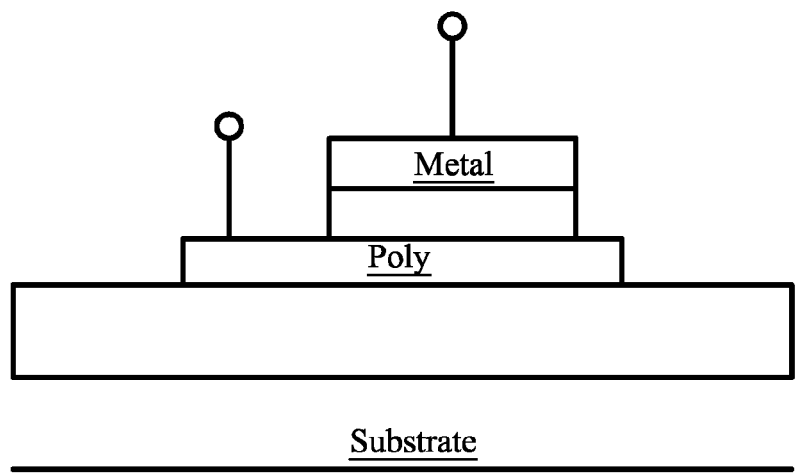
Figure 6:
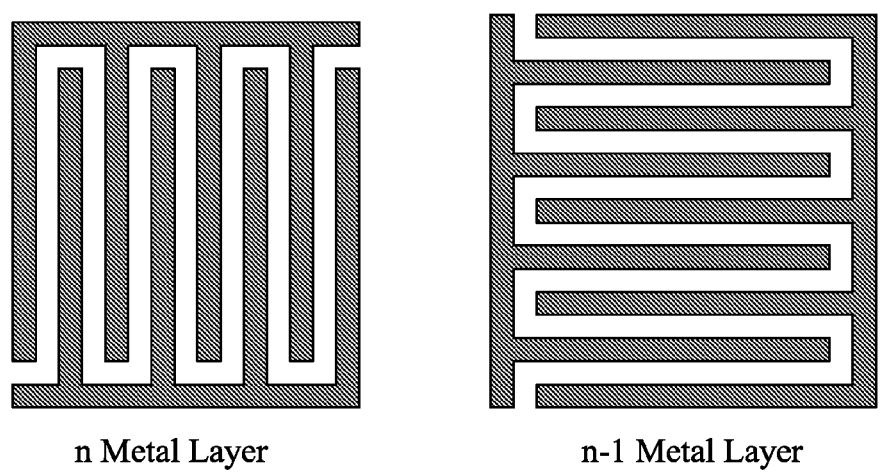
Figure 7A:
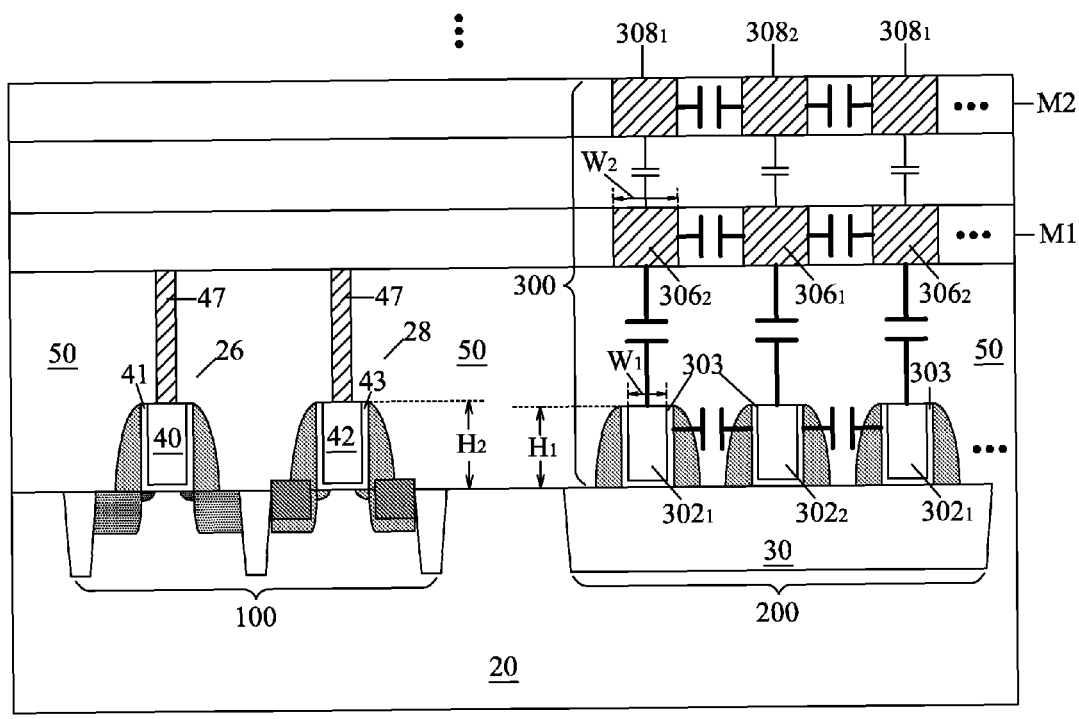
FIG. 7A illustrates a capacitor embodiment of the present invention, wherein the electrodes of transistors and the conductive lines of a capacitor are formed using a gate-last approach.

FIG. 7A illustrates a cross-sectional view of an embodiment of the present invention. Each of first device region 100 and second device region 200 includes a portion of substrate 20 and the overlying regions. Substrate 20 is preferably a semiconductor substrate formed of, for example, silicon, silicon germanium, GaAs, or the like. Substrate 20 may be a bulk substrate such as a bulk silicon substrate, or may be a semiconductor-on-insulator (SOI) structure. First device region 100 may be a memory region, for example, static random access memory (SRAM), or a logic region (also referred to as being a core region), wherein the devices formed in region 100 (for example, devices 26 and 28 as shown in FIG. 7A) may be complementary metal-oxide-semiconductor (CMOS) transistors, bipolar junction transistors, or BiCMOS transistors including both CMOS and bipolar junction transistors. Also, the devices formed in region 100 may be Fin field-effect transistors (FinFETs). Second device region 200 is a capacitor region for forming a capacitor. First device region 100 and second device region 200 may be spaced apart from each other, or closely located to (or even adjoining) each other. In first device region 100, n-type metal-oxide-semiconductor (NMOS) transistor 26 and p-type metal-oxide-semiconductor (PMOS) transistor 28 are formed. In second device region 200, isolation region 30, which may be a field oxide or a shallow trench isolation (STI) region, is formed in substrate 20. Throughout the description, isolation structure 30 is referred to as being STI region 30.

In second device region 200, capacitor 300 is formed over STI region 30. Capacitor 300 includes a plurality of parallel fingers 302 overlying STI region 30. Fingers 302 further includes a first plurality of fingers $302_1$ forming a first capacitor electrode, and a second plurality of fingers $302_2$ forming a second capacitor electrode, wherein fingers $302_1$ and $302_2$ are arranged in an alternating pattern. Further, a first bus $302_3$ and a second bus $302_4$ (not shown in FIG. 7, refer to FIG. 9), which are formed of a same material, and formed simultaneously with the formation of fingers $302_1$ and $302_2$, may be used to interconnect fingers $302_1$ and fingers $302_2$, respectively.

Fingers 302 may be formed simultaneously with the formation of gate electrodes 40 and/or 42. Accordingly, the height H1 of fingers 302 may be substantially equal to the height H2 of gate electrodes 40 and/or 42. Further, fingers 302 are formed of a same material as that of gate electrodes 40 and/or 42. Each of fingers $302_1$ and $302_2$ are separated from STI region 30 by a dielectric layer 303, which is formed simultaneously with, and hence comprises a same material as, one or both of gate dielectrics 41 and 43. In a first embodiment, gate electrodes 40 and 42 are formed of a same material as fingers 302, which material may include polysilicon, metals, metal silicides or the like. Please note that if fingers 302 are formed of polysilicon, each of them will include a polysilicon portion and an overlying silicide portion. In alternative embodiments, electrodes 40 and 42 are formed of different materials, such as different metals. For example, gate electrode 40 of NMOS device 26 may be formed of a low work-function material with a work function close to the valence band of silicon, while gate electrode 42 of PMOS device 28 may be formed of a high work-function material with a work function close to the conduction band of silicon. In this case, fingers 302 may be formed simultaneously with, and hence formed of a same material as, either one of gate electrodes 40 and 42.

Gate dielectrics 41 and 43 may be formed of a high-k dielectric material, for example, having a k value greater than about 8, and more preferably greater than about 20. The exemplary material includes Hf, $HfO_3$, $ZrO_2$, $LaO_3$, or the like. Accordingly, dielectric layers 303 may also be formed of high-k dielectric materials, which may, or may not, be the same dielectric materials as in gate dielectrics 41 and 43.

Preferably, the use of high-k dielectric gate dielectrics 41 and 43 may be combined with the use of metal in gate electrodes 40 and 42.

Figure 7B:
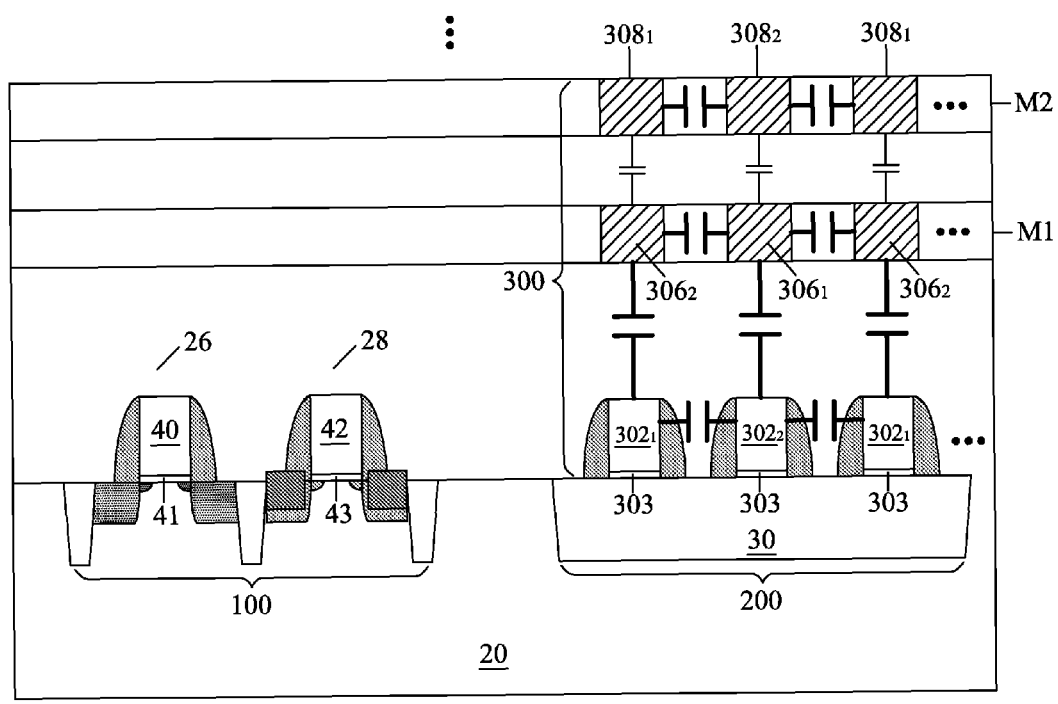
FIG. 7B illustrates a capacitor embodiment of the present invention, wherein the electrodes of transistors and the conductive lines of a capacitor are formed using a gate-first approach.

FIG. 7A also illustrates that the gates of NMOS transistor 26 and PMOS transistor 28 are formed using a gate-last approach, so that gate dielectrics 41 and 43 extend on sidewalls of the respective gate electrodes 40 and 42. In this case, fingers 302 may also have a gate-last structure, meaning that each of dielectric layers 303 includes portions extending on sidewalls of fingers $302_1$ and fingers $302_2$. Due to process reasons, the top surfaces of fingers $302_1$ and fingers $302_2$ formed using the gate-last approach may be leveled to the top surface of one (and possibly both) of gate electrodes 40 and 42. Alternatively, as shown in FIG. 7B, fingers 302 may have gate-first structures, meaning that dielectric layers 303 do not extend on the sidewalls of fingers $302_1$ and fingers $302_2$. In this case, at the time gate electrodes 40 and 42 are replaced to form the gate-last structures, the materials of fingers 302 are not replaced. Accordingly, fingers 302 and gate electrodes 40 and 42 may all be formed of materials different from each other.

Preferably, capacitor 300 further includes M1 portions, which are metal fingers 306 formed in the bottom metal layer M1. As is known in the art, metal layer M1 is the metal layer immediately over inter-dielectric (ILD) 50, in which contact plugs 47 connected to gate electrodes 40/42 are formed. ILD 50 has a top surface substantially flat throughout the chip. Preferably, each of metal fingers 306 is directly over, and hence vertically aligned to, one of fingers 302. Fingers 306 and fingers 302 are also parallel to each other. In the preferred embodiment, width W1 of fingers 302 is substantially equal to width W2 of fingers $306_1$ although they can also be different from each other. Fingers 306 include a first plurality of fingers $306_1$ forming a first capacitor electrode, and a second plurality of fingers $306_2$ forming a second capacitor electrode electrically insulated from the first capacitor electrode. Fingers $306_1$ and $306_2$ are arranged in an alternating pattern. Further, metal layer M1 includes a first bus and a second bus (not shown in FIG. 7A, refer to FIG. 8), which are formed of a same material as, and formed simultaneously with, fingers $306_1$ and $306_2$. The first bus and the second bus may be used to interconnect fingers $306_1$ and fingers $306_2$, respectively. Fingers $302_1$ may be connected to fingers $306_1$ through contact plug 307 (not shown in FIG. 7A, refer to FIG. 9). Fingers $302_2$ may be connected to fingers $306_2$ through contact plug 309 (not shown in FIG. 7A, refer to FIG. 9).

Figure 8:
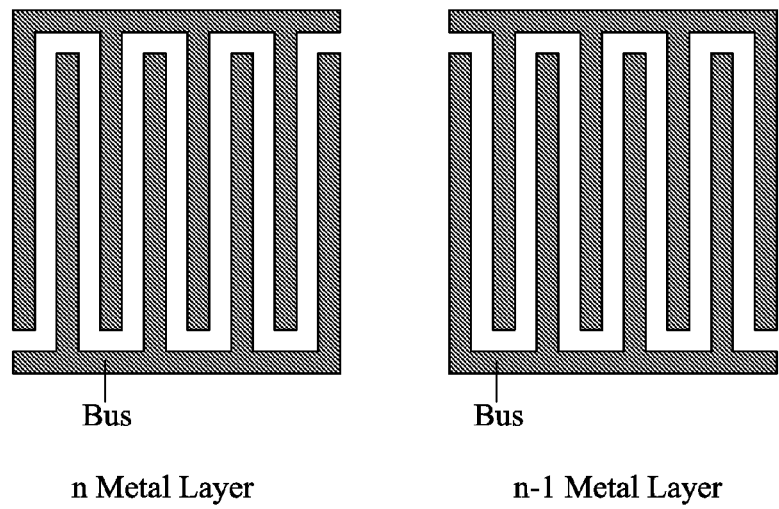
FIG. 8 illustrates a top view of portions of a capacitor in two neighboring metal layers.

Optionally, capacitor 300 may further include portions in metal layer 2 (M2) and/or overlying metal layers. FIG. 8 illustrates a top view of the capacitor fingers in metal layers n and n−1, wherein n is an integer no less than 2. Similar to the M1 portions of capacitor 300, the M2 portions of capacitor 300 include alternating metal fingers 308 parallel to, and vertically overlapping, fingers 306. Again, fingers 308 include fingers $308_1$ connected to fingers $306_1$, and fingers $308_2$ connected to fingers $306_2$. As is known in the art, layers M1 and M2 are separated by a dielectric layer, which is preferably a low-k dielectric layer having a k value less than about 3.5. FIGS. 7A and 7B reveal that the capacitor fingers are not only arranged (and connected) in an alternating pattern in a same layer, but are also arranged (and connected) in an alternating pattern in different layers. Accordingly, the capacitance of capacitor 300 includes four components, the capacitance between fingers 302, the capacitance between metal fingers 306 (and 308, and the like, if any), the capacitance between each of fingers 302 and its respective overlying finger 306, and the capacitance between the fingers in different metal layers M1, M2, and the like. Advantageously, by using the gate-last approach for forming gate electrodes 40 and 42, which causes the thickness of ILD 50 to be reduced to about one third of the value in the gate-first approach, the capacitance between each of fingers 302 and its respective overlying finger 306 may be increased to three times the original value, and hence the overall capacitance of capacitor 300 is significantly increased.

In alternative embodiments, between ILD 50 and an upper metal layer in which capacitor 300 has fingers therein, one or more of the metal layers M1 through Mtop−1 may not have any fingers formed therein. For example, an exemplary capacitor 300 includes fingers 302 in ILD 50 and fingers 308 in metal layer M2, while fingers 306 are not formed in metal layer M1. Please note that capacitor 300 may have fingers in any combinations of layers including ILD 50 and metal layers M1 through Mtop.

Figure 9:
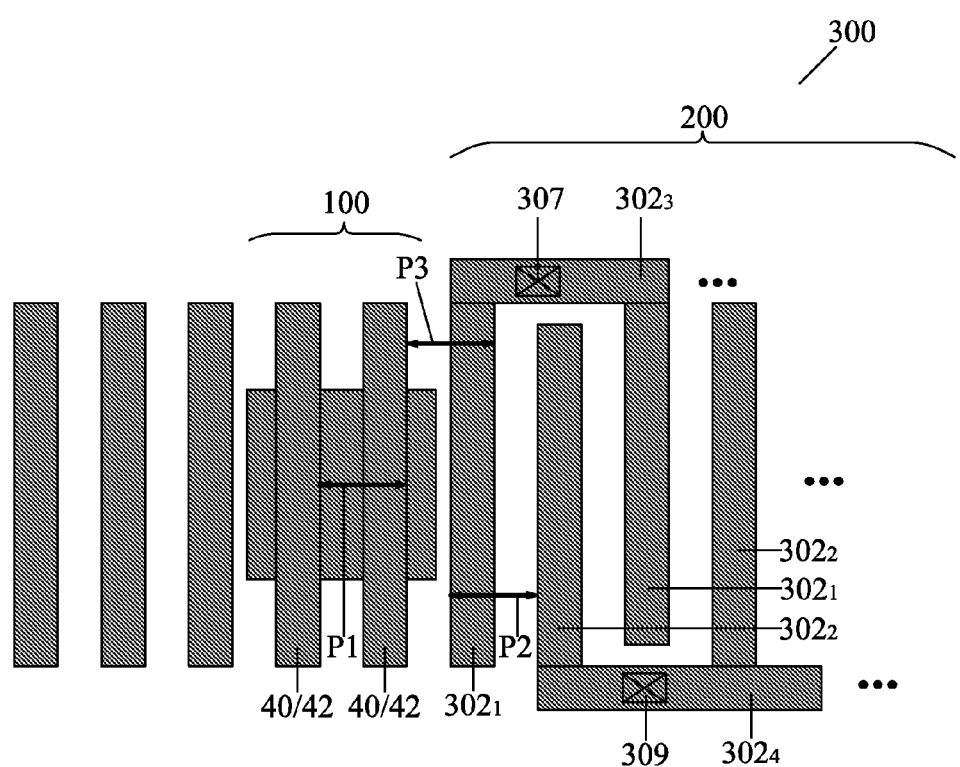
FIG. 9 illustrates a top view of a bottom layer of a capacitor and a neighboring transistor.

FIG. 9 illustrates a top view of capacitor 300, wherein the fingers in metal layer M1 and up are not shown. It is noted that fingers 302 are formed of conventional dummy gate electrodes, which are filled into the pattern-sparse regions to reduce the so-called pattern-loading effect. Accordingly, fingers 302 are preferably parallel to gate electrodes 40 (or 42) of the neighboring MOS transistors, although they can also be perpendicular. Gate electrodes 40 or 42 may have a first pitch P1, and fingers 302 may have a second pitch P2. Under the restricted design rules for 32 nm and below, pitch P1 is equal to P2. Further, pitch P3 between gate electrode 40/42 and the nearest finger 302 is also preferably equal to pitches P1 and/or P2.

Figure 10:
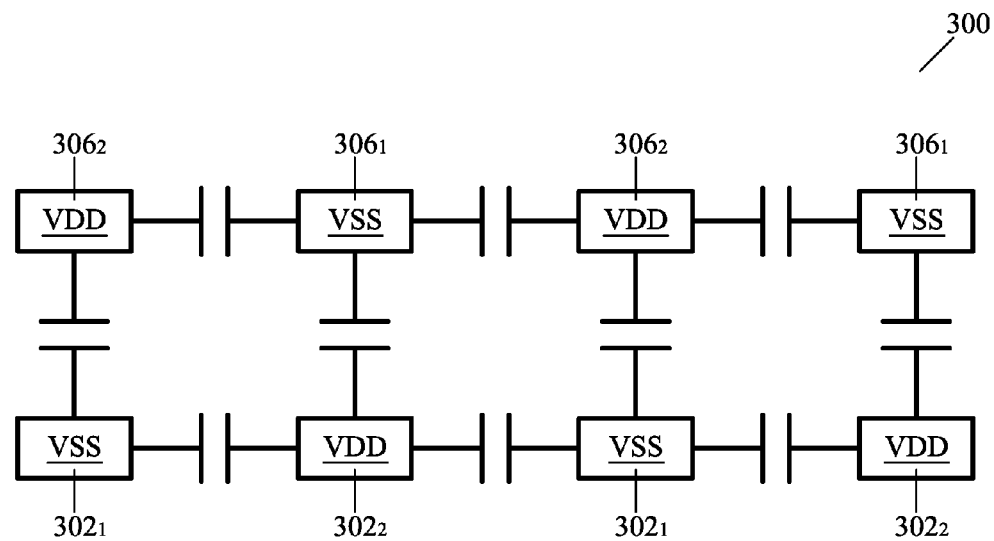
FIG. 10 illustrates a schematic cross-sectional view of two layers of a capacitor, wherein alternating fingers of the capacitor in both layers are connected to a VDD power rail or a VSS power rail.
Figure 11:
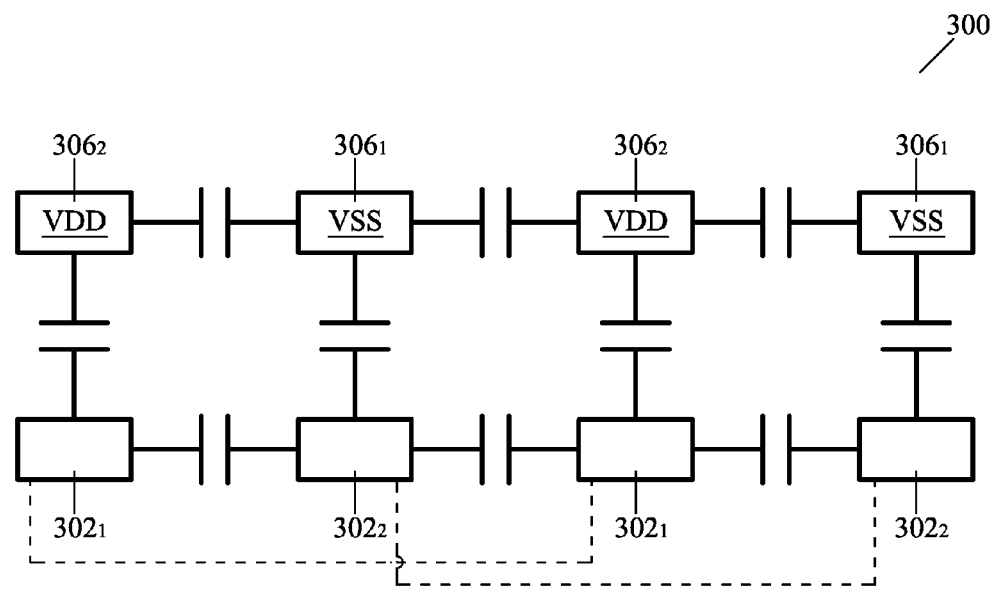
FIG. 11 illustrates a schematic cross-sectional view of two layers of a decoupling capacitor, wherein the fingers in the bottom layer of the capacitor are electrically floating, while alternating fingers of the capacitor in the overlying layer are connected to a VDD power rail or a VSS power rail.

The alternating fingers $302_1/302_2$ and $306_2/306_1$ may be connected to power rails VDD and VSS, as is shown in FIG. 10. Capacitor 300 is thus used as a decoupling capacitor for shunting the power noise carried by power rails VDD and/or VSS. Alternatively, fingers 302 may be floating (and hence fingers 302 are not connected to any of fingers 306 and the VDD and VSS power rails), as is shown in FIG. 11. In this case, the capacitance of capacitor 300 does not have the capacitance component between fingers 302, while all other capacitance components will remain. In a first embodiment, fingers $302_1$ are interconnected, and fingers $302_2$ are interconnected, although the interconnected fingers $302_1$ and $302_2$ are still floating. In alternative embodiments, none of the fingers 302 is connected to any of the other fingers 302.

The embodiments of the present invention have several advantageous features. First, the capacitor of the present invention utilizes the dummy features that otherwise would not be used to form any device, and hence the chip area is saved. Second, by incorporating the capacitance component between fingers 302 and their overlying fingers 306, the capacitance per unit area is significantly increased. Third, the decoupling capacitor of the present invention is substantially free from leakage currents. Experiment results have shown that the leakage current of the chip incorporating the embodiments of the present invention may be reduced by about 15 percent to about 20 percent. Fourth, the capacitors of the present invention do not require double oxides, which are conventionally required by the decoupling capacitors formed in the core device regions. The embodiments of the present invention may be applied on BiCMOS circuits, FinFETs, carbon tube wire technologies, and the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a semiconductor substrate comprising a first region and a second region;
    an insulation region in the second region of the semiconductor substrate;
    an inter-layer dielectric (ILD) over the insulation region;
    a transistor in the first region, the transistor comprising a gate dielectric, and a gate electrode over the gate dielectric, wherein the gate electrode has a first pitch from a neighboring gate electrode;
    a first conductive line and a second conductive line over the insulation region, wherein the first conductive line and the second conductive line are substantially parallel to each other and extending in a first direction, and wherein the first conductive line and the second conductive line have a second pitch substantially equal to the first pitch; and
    a first metal line and a second metal line in a metal layer over the ILD and extending in the first direction, wherein the first metal line and the second metal line form two capacitor electrodes of a capacitor.

2. The integrated circuit structure of claim 1, wherein the metal layer is a bottom metal layer (M1), and wherein the first metal line and the second metal line substantially vertically overlap the first conductive line and the second conductive line, respectively.

3. The integrated circuit structure of claim 1, wherein the first conductive line is connected to the second metal line, and the second conductive line is connected to the first metal line.

4. The integrated circuit structure of claim 1, wherein the first conductive line and the second conductive line are floating.

5. The integrated circuit structure of claim 1 further comprising:
    a power rail VDD connected to the first conductive line; and
    a power rail VSS connected to the second conductive line.

6. The integrated circuit structure of claim 1, wherein the first conductive line and the second conductive line are formed of same materials as the gate electrode.

7. The integrated circuit structure of claim 6, wherein the first conductive line and the second conductive line comprise polysilicon.

8. The integrated circuit structure of claim 6, wherein the first conductive line and the second conductive line are metal lines, and the gate electrode is a metal gate electrode, and wherein the gate dielectric comprises a high-k dielectric material.

9. The integrated circuit structure of claim 1, wherein the first conductive line, the second conductive line, and the gate electrode have gate-first structures.

10. The integrated circuit structure of claim 1, wherein the first conductive line, the second conductive line, and the gate electrode have gate-last structures.

11. The integrated circuit structure of claim 1 further comprising sidewall spacers on sidewalls of the gate electrode and sidewalls of the first conductive line and the second conductive line.

12. The integrated circuit structure of claim 1, wherein the transistor is a complementary metal-oxide-semiconductor (CMOS) transistor.

13. The integrated circuit structure of claim 1, wherein the transistor is a bipolar junction transistor.

14. An integrated circuit structure comprising:
    a semiconductor substrate;
    an inter-layer dielectric (ILD) over the semiconductor substrate;
    a metal layer over the ILD; and
    a capacitor over the semiconductor substrate, the capacitor comprising:
        a first layer in the ILD and comprising a first capacitor electrode and a second capacitor electrode, each comprising a bus and fingers connected to the bus, wherein the fingers of the first capacitor electrode and the second capacitor electrode are substantially parallel to each other and are placed in an alternating pattern, and wherein the first capacitor electrode and the second capacitor electrode are floating; and
        a second layer in the metal layer and comprising a third capacitor electrode and a fourth capacitor electrode insulated from each other, wherein each of the third capacitor electrode and the fourth capacitor electrode comprises a bus and fingers connected to the bus, wherein the fingers of the third capacitor electrode and the fourth capacitor electrode are substantially parallel to the fingers of the first capacitor electrode and the second capacitor electrode, and are placed in an alternating pattern, and wherein each of the fingers of the first capacitor electrode vertically overlaps one of the fingers of the fourth capacitor electrode, and each of the fingers of the second capacitor electrode vertically overlaps one of the fingers of the third capacitor electrode.

15. The integrated circuit structure of claim 14 further comprising:
    a transistor comprising:
        a gate dielectric over the semiconductor substrate; and
        a gate electrode over the gate dielectric, wherein the gate electrode comprises a portion level with a portion of the ILD; and
    a contact plug over and connected to the gate electrode, wherein the contact plug comprises a bottom surface substantially level with a top surface of the gate electrode, and a bottom surface substantially level with a top surface of the ILD.

16. The integrated circuit structure of claim 14, wherein the third capacitor electrode and the fourth capacitor electrode are connected to a VDD power rail and a VSS power rail, respectively.

17. The integrated circuit structure of claim 14, wherein the metal layer is a bottom metal layer (M1).

* * * * *